United States Patent
Kao et al.

(10) Patent No.: US 9,509,301 B2
(45) Date of Patent: Nov. 29, 2016

(54) VOLTAGE CONTROL OF SEMICONDUCTOR INTEGRATED CIRCUITS

(71) Applicant: TAIWAN SEMICONDUCTOR MANUFACTURING COMPANY, LTD., Hsinchu (TW)

(72) Inventors: Jerry Chang-Jui Kao, Taipei (TW); Chien-Ju Chao, New Taipei (TW); Chou-Kun Lin, Hsin-Chu (TW); Chin-Shen Lin, Taipei (TW); King-Ho Tam, Hsinchu (TW); Kuo-Nan Yang, Hsinchu (TW); Chung-Hsing Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 588 days.

(21) Appl. No.: 13/931,514

(22) Filed: Jun. 28, 2013

(65) Prior Publication Data
US 2015/0001934 A1 Jan. 1, 2015

(51) Int. Cl.
*H02M 3/156* (2006.01)
*H03K 17/296* (2006.01)
*H03K 17/284* (2006.01)

(52) U.S. Cl.
CPC .......... *H03K 17/296* (2013.01); *H03K 17/284* (2013.01); *Y10T 307/406* (2015.04)

(58) Field of Classification Search
None
See application file for complete search history.

(56) References Cited

U.S. PATENT DOCUMENTS

| | | | |
|---|---|---|---|
| 6,876,252 B2 | 4/2005 | Kim et al. | |
| 7,142,019 B2 | 11/2006 | Mair et al. | |
| 2007/0121370 A1* | 5/2007 | Ellis | G11C 11/413 365/154 |
| 2008/0001655 A1 | 1/2008 | Pham et al. | |
| 2008/0136395 A1* | 6/2008 | Bennett | H02M 3/156 323/288 |
| 2008/0180157 A1 | 7/2008 | Choi et al. | |
| 2010/0097097 A1 | 4/2010 | Kim et al. | |
| 2012/0280572 A1* | 11/2012 | Li | H02J 7/0026 307/77 |

OTHER PUBLICATIONS

Kim, et al. "Minimizing Inductive Noise in System-On-a-Chip with Multiple Power Gating Structures" ESSCIRC 2003.

* cited by examiner

*Primary Examiner* — Jared Fureman
*Assistant Examiner* — Aqeel Bukhari
(74) *Attorney, Agent, or Firm* — McDermott Will & Emery LLP (57) ABSTRACT

A circuit is disclosed that includes a plurality of voltage control circuits. Each voltage control circuit of the voltage control circuits includes a driver circuit and a switch circuit. The driver circuit is configured to receive a control signal having a series of pulses. The switch circuit is configured to generate a driving voltage when being turned on. The driver circuit alternately turns on and off the switch circuit in accordance with the series of pulses.

21 Claims, 7 Drawing Sheets

VOLTAGE CONTROL OF SEMICONDUCTOR INTEGRATED CIRCUITS

FIELD

The present disclosure relates to voltage control of semiconductor integrated circuits.

BACKGROUND

In nano-scale process of semiconductor devices, power consumption sharply increases due to leakage current. In order to reduce the leakage current, a technique referred to as power gating is used. Power gating is used to cut off power supplied to a circuit in a chip when the circuit is not in operation.

However, when power is supplied to wake up the circuit, an inrush current is generated and rapidly flows through the circuit. Therefore, inductive power noise occurs in the chip due to the inrush current. Further, electromigration (EM) also occurs and leads to electrical failure of interconnects in the semiconductor devices. As a result, the chip has an abnormal operation.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
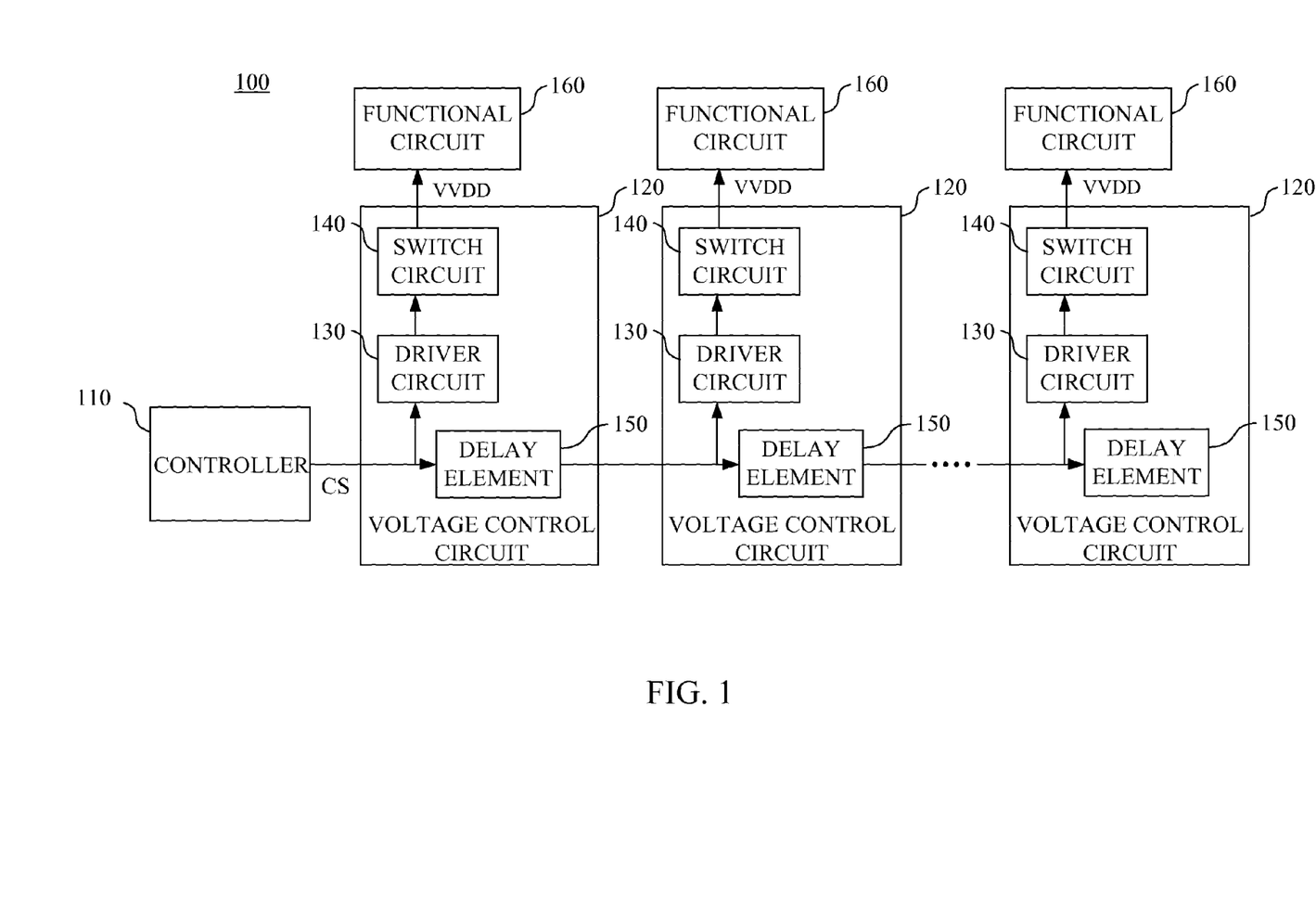
FIG. 1 is a schematic diagram of a semiconductor integrated circuit in accordance with some embodiments of the present disclosure.

FIG. 1 is a schematic diagram of a semiconductor integrated circuit 100 in accordance with some embodiments of the present disclosure.

In the semiconductor integrated circuit 100, the voltage control circuits 120 are connected in series with the controller 110. For example, one voltage control circuit 120 receives signal(s) from another voltage control circuit 120. As illustratively shown in FIG. 1, the first voltage control circuit 120 in the chain of voltage control circuits 120 receives a signal CS from the controller 110, the next voltage control circuit 120 receives a signal from the delay element 150 of the previous voltage control circuit 120, and, finally, the last voltage control circuit 120 in the chain of voltage control circuits receives a signal from the delay element 150 of the next-to-last voltage control circuit 120.

The controller 110 is configured to generate the control signal CS for controlling the voltage control circuits 120. In some embodiments, the controller 110 is a pulse width modulator, and the control signal CS has a series of pulses which, in various embodiments, have modulated widths.

The voltage control circuits 120 connected in series in FIG. 1 are for illustrative purposes. In some embodiments, the voltage control circuits 120 are connected in parallel with the controller 110. For example, the voltage control circuits 120 each receive the identical control signal CS from the controller 110. In some other embodiments, the voltage control circuits 120 are connected both in series and in parallel with the controller 110.

The voltage control circuits 120 in FIG. 1 are given for illustrative purposes. Various numbers and configurations of the voltage control circuits 120 are within the contemplated scope of the present disclosure.

Each of the voltage control circuits 120 is configured to generate a driving voltage VVDD for a corresponding functional circuit 160. Each of the voltage control circuits 120 includes a driver circuit 130, a switch circuit 140 and a delay element 150. In some embodiments, the switch circuit 140 is referred to as a power gating switch.

In a voltage control circuit 120, the driver circuit 130 is configured to receive the control signal CS to alternately turn on and off the switch circuit 140 in accordance with the control signal CS. The switch circuit 140, when being turned on, is configured to generate the driving voltage VVDD. The delay element 150 is configured to delay the control signal CS, and to transmit the delayed control signal CS to the subsequent voltage control circuit 120.

Explained in a different way, the delay elements 150 in the voltage control circuits 120 are connected in series, and operate together as a delay chain. For example, the control signal CS is transmitted from the controller 110 sequentially through the delay elements 150 of the voltage control circuits 120. As illustratively shown in FIG. 1, the control signal CS is transmitted through the delay element 150 of the first voltage control circuit 120 to the delay element 150 of the second voltage control circuit 120, and then to the following delay element 150 of the following voltage control circuit 120, and so on.

For simplicity, operations of the circuits in one voltage control circuit 120 and the corresponding functional circuit 160 are illustratively described. Operations of other control circuits 120 and corresponding functional circuits 160 are similar. When the functional circuit 160 is in a non-operation state, e.g., in a sleep mode, the driver circuit 130 turns off the switch circuit 140. Accordingly, the switch circuit 140 stops generating the driving voltage VVDD for the functional circuit 160. As a result, leakage current in the functional circuit 160 is prevented because the driving voltage VVDD is not supplied for the functional circuit 160 in the non-operation state.

In contrast, when the functional circuit 160 is in an operation state, the driver circuit 130 turns on the switch circuit 140. As a result, the switch circuit 140 generates the driving voltage VVDD for the functional circuit 160 to function. Alternatively stated, the functional circuit 160 is awaken by the corresponding voltage control circuit 120.

In some embodiments, when the control signal CS is at a high logical level, the driver circuit 130 turns off the switch circuit 140. In contrast, when the control signal CS is at a low logical level, the driver circuit 130 turns on the switch circuit 140.

Figure 2:
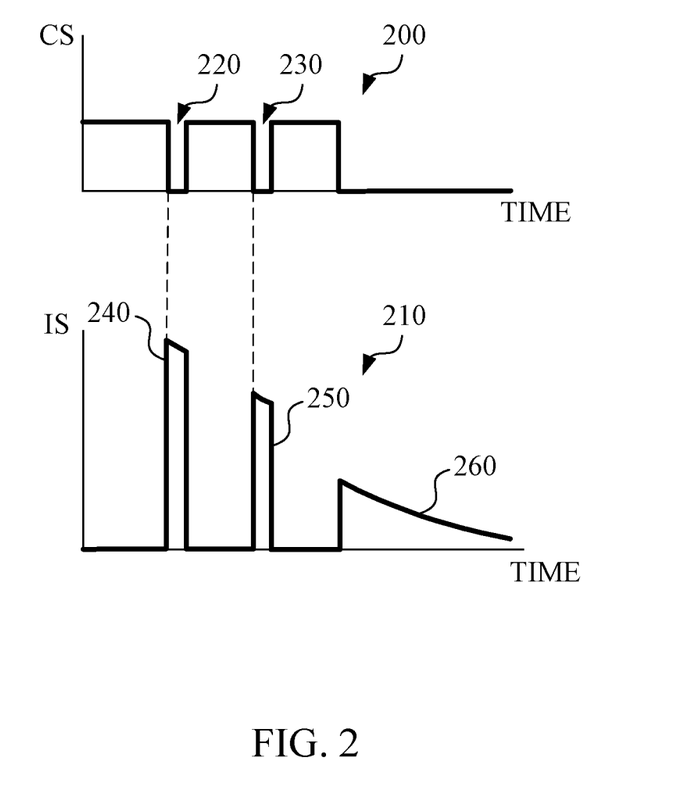
FIG. 2 is a graph illustrating operation waveforms of the semiconductor integrated circuit in FIG. 1, in accordance with some embodiments of the present disclosure.

FIG. 2 is a graph illustrating operation waveforms 200 of the control signal CS and operation waveforms 210 of the current IS corresponding to the control signal CS, in accordance with some embodiments of the present disclosure. For illustration, the control signal CS has a series of negative pulses 220 and 230 over time. The current IS indicates the current generated when the switch circuit 140 in FIG. 1 is turned on, and has a series of positive pulses 240 and 250, which correspond to the negative pulses 220 and 230, respectively. The current IS flows through the switch circuit 140 to the functional circuit 160. Details of the operation waveforms 200 and 210 are explained below with reference to FIG. 3.

Figure 3:
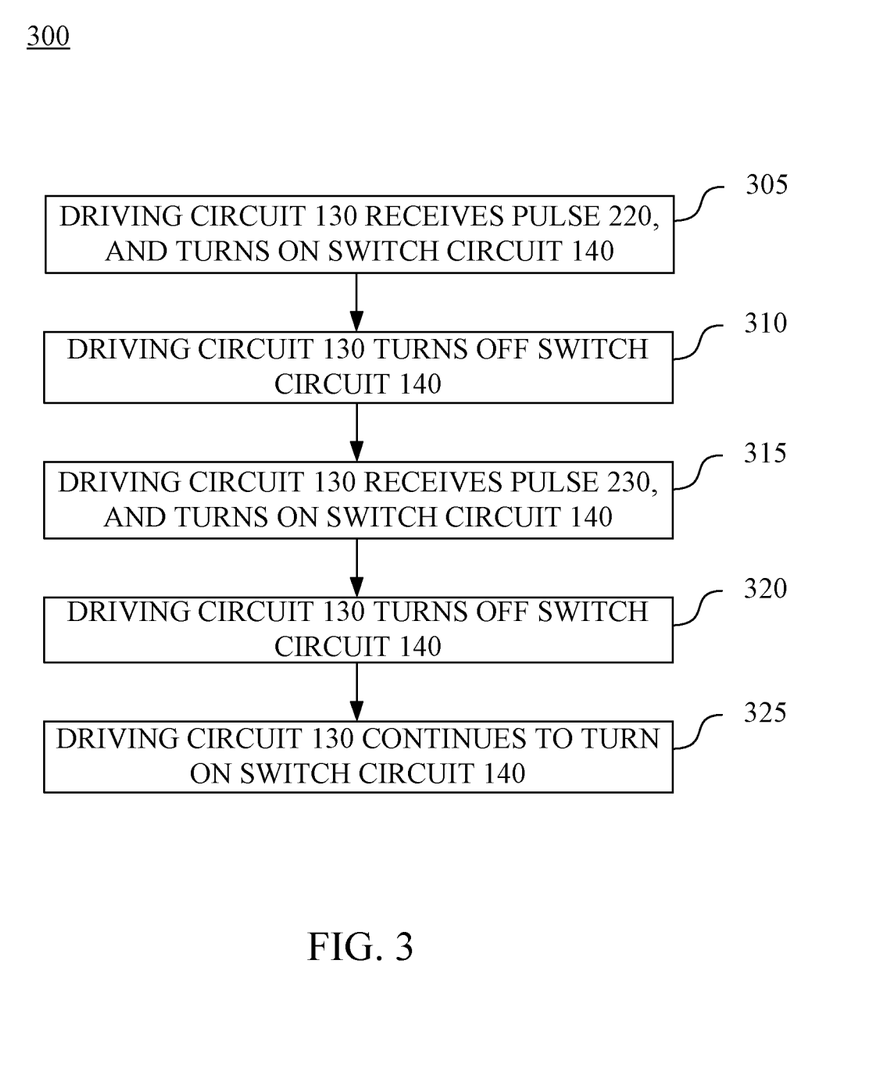
FIG. 3 is a flow chart of a method illustrating operations of the voltage control circuit in FIG. 1, in accordance with some embodiments of the present disclosure.

FIG. 3 is a flow chart of a method 300 illustrating operations of the voltage control circuit 120 in FIG. 1, in accordance with some embodiments of the present disclosure. For illustration, the operations of the voltage control circuit 120 in FIG. 1 are described by the method 300 together with the waveforms in FIG. 2, when the functional circuit 160 is switched from the non-operation state to the operation state and remains in the operation state.

In operation 305, the driving circuit 130 receives the pulse 220, and thus turns on the switch circuit 140 in accordance with the pulse 220. As a result, a corresponding current pulse 240 is generated, which flows through the switch circuit 140 to the functional circuit 160.

In operation 310, after the pulse 220, the driving circuit 130 turns off the switch circuit 140. Accordingly, there is no current IS.

In operation 315, the driving circuit 130 receives the pulse 230, and thus turns on the switch circuit 140 again, in accordance with the pulse 230. As a result, a corresponding current pulse 250 is generated, which flows through the switch circuit 140.

In operation 320, after the pulse 230, the driving circuit 130 turns off the switch circuit 140 again, and, accordingly, there is no current IS.

In operation 325, the driving circuit 130 continues to turn on the switch circuit 140 in accordance with the control signal CS maintained at the low logical level. As a result, the current IS is generated and has a gradually decreasing current waveform 260. The current IS then approaches to be constant.

Based on the operations illustratively shown in FIG. 2, the inrush current including the current pulses 240 and 250 flows through the switch circuit 140 to the functional circuit 160, and is distributed in different time periods corresponding to the pulses 220 and 230. As a result, the failure and abnormal operation of the functional circuits 160 due to the inrush current is prevented.

In some embodiments, the amount of the current IS, which is indicated by the area under the current pulse 240 or 250, varies when the width of the pulses 220 and 230 is modulated. For example, when the width of the pulse 220 or 230 is larger, the time period when the switch circuit 140 is turned on becomes longer. Therefore, the area under the current pulse 240 or 250 increases according to the time period of the switch circuit 140 being turned on. Effectively, the amount of the current IS corresponding to the area under the current pulse 240 or 250 increases. In contrast, when the width of the pulses 220 and 230 is smaller, the amount of the current IS corresponding to the area under the current pulse 240 or 250 decreases accordingly. Modulating the width of the pulses 220 and 230 prevents the amount of the current IS from exceeding a threshold value. Explained in a different way, the amount of the current IS is controlled by modulating the pulse width of the control signal CS.

The number and widths of the pulses in FIG. 2 are given for illustrative purposes. Other numbers and widths of the pulses are within the contemplated scope of the present disclosure. Moreover, the negative pulses of signal CS in FIG. 2 are given for illustrative purposes. Positive pulses are within the contemplated scope of the present disclosure.

Figure 4:
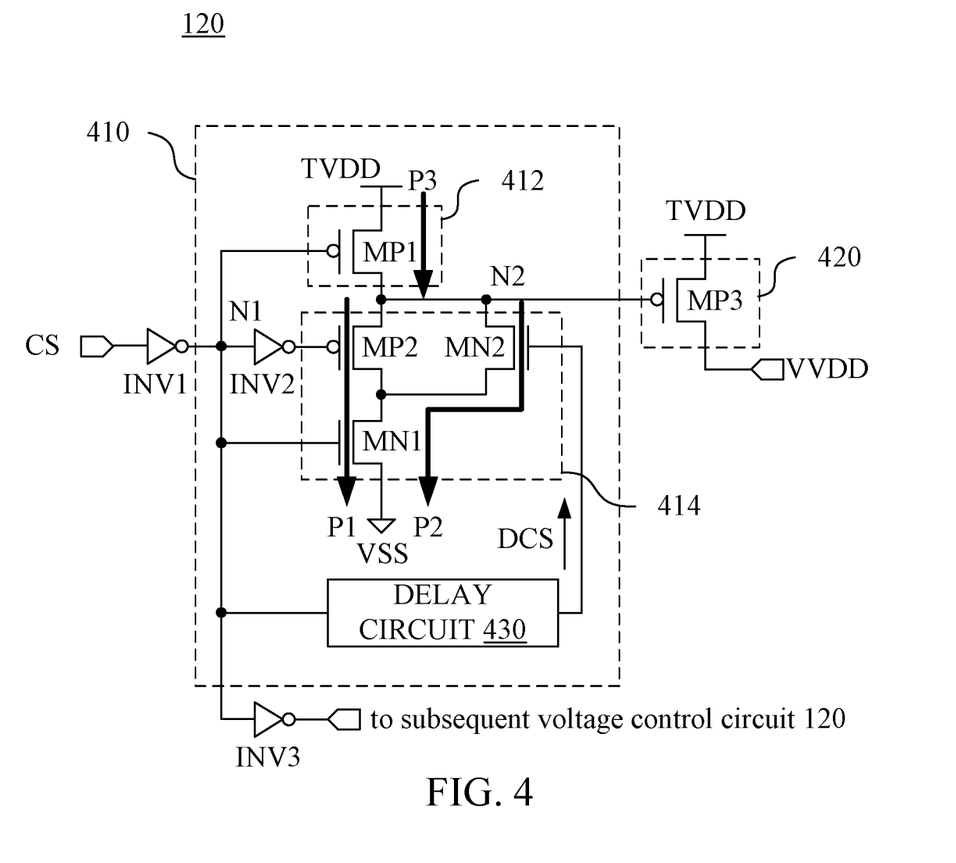
FIG. 4 is a schematic circuit diagram of the voltage control circuit in FIG. 1 in accordance with some embodiments of the present disclosure.

FIG. 4 is a schematic circuit diagram of the voltage control circuit 120 in FIG. 1 in accordance with some embodiments of the present disclosure.

Two inverters INV1 and INV3 are connected in series at a node N1, to operate as the delay element 150 in FIG. 1. The inverter INV1 receives the control signal CS, and the inverter INV3 outputs the delayed control signal CS to the subsequent voltage control circuit 120.

The switch circuit 420 includes a transistor MP3 such as a PMOS transistor. The transistor MP3 has a gate connected to the driver circuit 410 at a node N2, a source connected to a supply voltage TVDD, and a drain configured to output the driving voltage VVDD.

In the driver circuit 410, an inverter INV2 has an input connected to the output of the inverter INV1 at the node N1, and an output connected to a pull-down circuit 414. A pull-up circuit 412 includes a transistor MP1 such as a PMOS transistor. The transistor MP1 has a gate connected to the node N1, a source connected to the supply voltage TVDD, and a drain connected to the node N2.

In the pull-down circuit 414, a first pull-down path P1 and a second pull-down path P2 are provided. In the first pull-down path P1, a transistor MN1 such as an NMOS transistor, and a transistor MP2 such as a PMOS transistor, are provided. The transistor MP2 has a gate connected to the output of the inverter INV2, a source connected to the node N2, and a drain connected to the transistor MN1. The transistor MN1 has a gate connected to the node N1, a drain connected to the transistor MP2, and a source connected to a reference voltage VSS which, in some embodiments, is ground. In the second pull-down path P2, a transistor MN2 such as an NMOS transistor is provided. The transistor MN2 has a gate connected to a delay circuit 430, a drain connected to the node N2, and a source connected to the drain of the transistor MN1.

The delay circuit 430 is connected between the gate of the transistor MN2 and the node N1. In some embodiments, the delay circuit 430 is configured to delay the signal at the node N1 to generate a delay signal DCS.

Detailed operations of the voltage control circuit 120 are explained with reference to FIG. 5 and FIG. 6.

Figure 5:
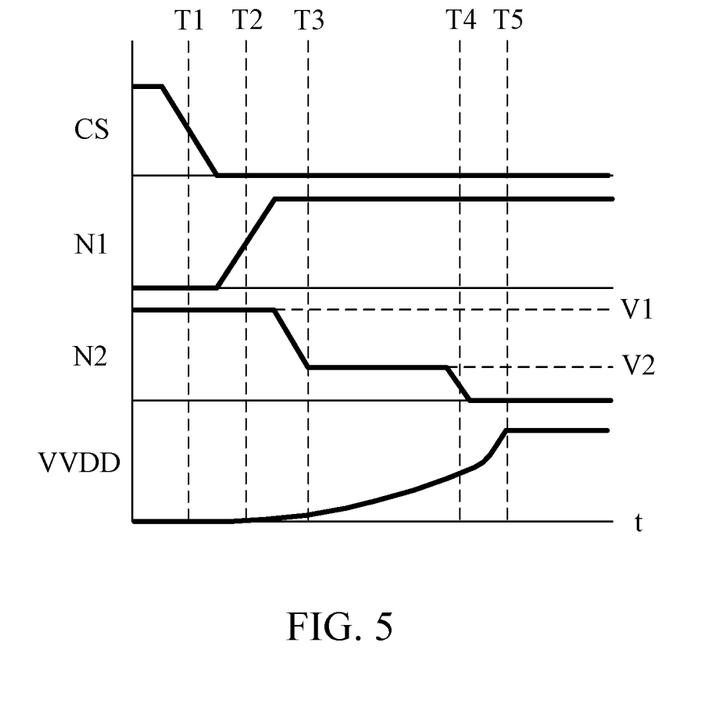
FIG. 5 is a graph of waveforms illustrating operations of the voltage control circuit in FIG. 4, in accordance with some embodiments of the present disclosure.

FIG. 5 is a graph of waveforms illustrating operations of the voltage control circuit 120 in FIG. 4, in accordance with some embodiments of the present disclosure. The operations of the voltage control circuit 120 in FIG. 4 correspond to a sleep mode, a wake-up mode, and an operation mode of the functional circuit 160 in FIG. 1, and are described below. Details of the waveforms in FIG. 5 are explained with reference to FIG. 6.

Figure 6:
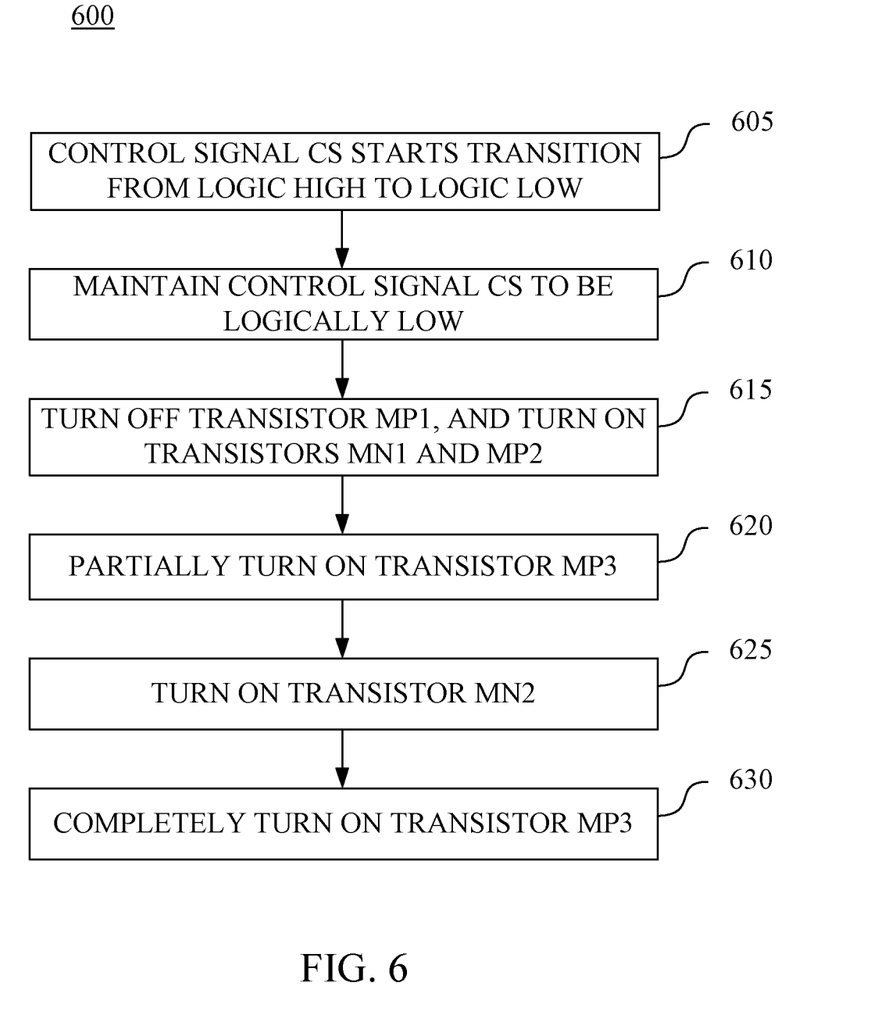
FIG. 6 is a flow chart of a method illustrating operations of the voltage control circuit in FIG. 4, in accordance with some embodiments of the present disclosure.

FIG. 6 is a flow chart of a method 600 illustrating operations of the voltage control circuit 120 in FIG. 4, in accordance with some embodiments of the present disclosure. The operations of the voltage control circuit 120 in FIG. 4 are described by the method 600 together with the waveforms in FIG. 5. Initially, before time T1 in FIG. 5, the functional circuit 160 in FIG. 1 is in the sleep mode. Further, before time T1, the control signal CS is logically high, and passes through the inverters INV1 and INV2 sequentially. As a result, the node N1 is logically low, and the output of the inverter INV2 is logically high. Because the node N1 is logically low, the transistor MP1 is turned on, a current is generated on a current path P3, and the transistor MN1 is turned off. Because the output of the inverter INV2 is logically high, the transistor MP2 is turned off. Because the transistors MN1 and MN2 are turned off and the transistor MP1 is turned on, the node N2 is pulled to the supply voltage TVDD at the source of the transistor MP1, and is thus logically high. As a result, the transistor MP3 is turned off, and there is no driving voltage VVDD at the drain of transistor MP3.

In operation 605 corresponding to time T1, the control signal CS transits from a logic high to a logic low value. As a result, the functional circuit 160 in FIG. 1 operates in the wake-up mode. The control signal CS passes through the inverter INV1 and cause the node N1 to transit from a low logical to a high logical value at time T2. The node N2 remains logically high.

The control signal CS transiting from a logic high to a logic low value at time T1 corresponds to the falling edge of the pulse 220 or 230 in FIG. 2, and is given for illustrative purposes. Signal CS transiting from a logic low to a logic high value is within the contemplated scope of the present disclosure.

In operation 615, corresponding to time T2, the node N1 is transiting to a logic high value. As a result, the transistor MP1 is turned off, and the transistor MN1 is turned on, by the node N1. Accordingly, the output of the inverter INV2 transits from a high logical value to a low logical value due to the node N1 transiting to a high logical value.

Moreover, the transistor MP2 is turned on by the output of the inverter INV2. As a result, the node N2 is pulled down through the first pull-down path P1. Corresponding to time T3, the node N2 is pulled down from a voltage V1 to a voltage V2. When the node N2 is pulled to the level of voltage V2, the transistor MP2 is turned off. Therefore, the node N2 is maintained at voltage V2 until time T4 as described below.

In operation 620, the transistor MP3 is partially turned on by the voltage V2 at the node N2. As a result, the driving voltage VVDD at the drain of the transistor MP3 is generated, and gradually increases in accordance with the supply voltage TVDD at the source of the transistor MP3.

In operation 625 corresponding to time T4, the transistor MN2 is turned on by the signal DCS, which is the signal CS delayed by the delay circuit 430. As a result, the node N2 is further pulled down to be logically low by the transistor MN2 through the second pull-down path P2. Accordingly, the transistor MP3 is further turned on by the node N2. Therefore, the driving voltage VVDD further increases in accordance with the supply voltage TVDD at the source of the transistor MP3.

In operation 630 corresponding to time T5, the transistor MP3 is completely turned on by the node N2. Moreover, the driving voltage VVDD has a determined voltage level corresponding to the supply voltage TVDD at the source of the transistor MP3. In some embodiments, the driving voltage VVDD is pulled to be the supply voltage TVDD at the source of the transistor MP3.

After time T5, the functional circuit 160 in FIG. 1 receives the driving voltage VVDD which is provided by the supply voltage TVDD, and thus operates in the operation mode.

Figure 7:
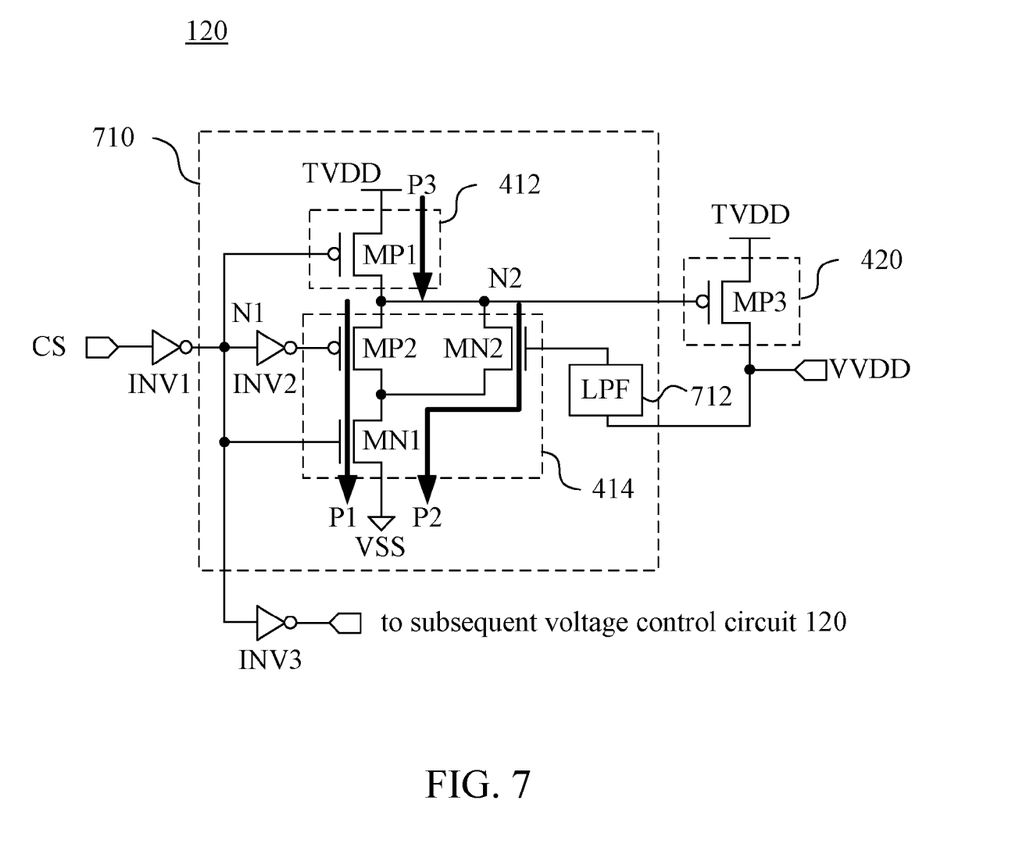
FIG. 7 is a schematic circuit diagram of the voltage control circuit in FIG. 1 in accordance with alternative embodiments of the present disclosure.

FIG. 7 is a schematic circuit diagram of the voltage control circuit 120 in FIG. 1 in accordance with alternative embodiments of the present disclosure.

Compared with the driver circuit 410 in FIG. 4, the driver circuit 710 in FIG. 7 does not include the delay circuit 430, but includes a low pass filter (LPF) 712. The low pass filter 712 is configured to filter glitches of the driving voltage VVDD. The gate of the transistor MN2 is connected through the low pass filter 712 to the drain of the transistor MP3. Explained in a different way, the gate of the transistor MN2 is controlled through the low pass filter 712 by the driving voltage VVDD.

In some embodiments, the driver circuit 710 does not include the low pass filter 712. Effectively, the driving voltage VVDD is transmitted to the gate of the transistor MN2 without passing the low pass filter 712. In brief, the transistor MN2 is controlled by the driving voltage VVDD with or without the low pass filter 712.

In operation, compared with FIG. 4, when the driving voltage VVDD in FIG. 7 increases gradually, the transistor MN2 is gradually turned on. As a result, the node N2 is further pulled down through the transistor MN2, and the transistor MP3 is further turned on. The driving voltage VVDD therefore increases until the driving voltage VVDD reaches the level of voltage TVDD at the source of the transistor MP3.

In some embodiments, a circuit is disclosed that includes a plurality of voltage control circuits. Each voltage control circuit of the voltage control circuits includes a driver circuit and a switch circuit. The driver circuit is configured to receive a control signal having a series of pulses. The switch circuit configured to generate a driving voltage when being turned on, wherein the driver circuit alternately turns on and off the switch circuit in accordance with the series of pulses.

Also disclosed is a circuit that includes a driver circuit and a switch circuit. The driver circuit includes a pull-up circuit and a pull-down circuit. The pull-down circuit includes a first pull-down path and a second pull-down path, wherein the driver circuit is configured to receive a control signal having a series of pulses. The switch circuit is configured to generate a driving voltage when being turned on. The driver circuit alternately turns on and off the switch circuit in accordance with the series of pulses. When the control signal is in a first state, the first pull-down path and the second pull-down path are sequentially activated in accordance with the control signal to turn on the switch circuit. When the control signal is in a second state, the pull-up circuit is activated in accordance with the control signal to turn off the switch circuit.

Also disclosed is a method that includes the operations below. A switch circuit is alternately turned on and off by a driver circuit in accordance with a control signal having a series of pulses for controlling the driver circuit. A driving voltage is generated by the switch circuit when the switch circuit is turned on.

In this document, the term "coupled" may be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit comprising:
  a plurality of voltage control circuits, each voltage control circuit of the voltage control circuits comprising:
    a driver circuit configured to receive a control signal from a corresponding voltage control circuit of the plurality of voltage control circuits, wherein the control signal has a series of pulses; and
    a switch circuit configured to generate a driving voltage when being turned on, wherein the driver circuit alternately turns on and off the switch circuit in accordance with the series of pulses.

2. The circuit of claim 1, further comprising:
  a controller configured to generate the control signal having the series of pulses.

3. The circuit of claim 1, further comprising:
  a delay chain configured to delay the control signal for generating different delayed control signals,
  wherein each driver circuit is configured to receive a corresponding delayed control signal of the delayed control signals.

4. The circuit of claim 1, further comprising:
  a plurality of delay elements connected in series to sequentially delay the control signal for generating a plurality of delayed control signals,
  wherein at least one driver circuit of the driver circuits in the voltage control circuits is configured to receive a delayed control signal of the delayed control signals.

5. The circuit of claim 1, wherein the series of pulses have different widths.

6. The circuit of claim 1, wherein the voltage control circuits are connected in series, in parallel, or a combination thereof, with the controller.

7. The circuit of claim 1, wherein
  the driver circuit in the corresponding voltage control circuit comprises a pull-down circuit comprising a first pull-down path and a second pull-down path; and
  when the control signal is in a first state, the first pull-down path and the second pull-down path are sequentially activated in accordance with the control signal to turn on the switch circuit.

8. The circuit of claim 7, wherein the first pull-down path comprises a first NMOS and a PMOS connected between the first NMOS and a control node of the switch circuit, and the second pull-down path comprises the first NMOS and a second NMOS connected between the control node and the first NMOS.

9. The circuit of claim 7, wherein
  the driver circuit further comprises a pull-up circuit; and
  when the control signal is in a second state, the pull-up circuit is activated in accordance with the control signal to turn off the switch circuit.

10. The circuit of claim 9, wherein the pull-up circuit comprises a PMOS connected to a control node of the switch circuit.

11. A circuit comprising:
  a driver circuit comprising a pull-up circuit and a pull-down circuit, the pull-down circuit comprising a first pull-down path and a second pull-down path, wherein the driver circuit is configured to receive a control signal having a series of pulses; and
  a switch circuit configured to generate a driving voltage when being turned on, the driver circuit alternately turning on and off the switch circuit in accordance with the series of pulses;
  wherein
  when the control signal is in a first state, the first pull-down path and the second pull-down path are sequentially activated in accordance with the control signal to turn on the switch circuit; and
  when the control signal is in a second state, the pull-up circuit is activated in accordance with the control signal to turn off the switch circuit.

12. The circuit of claim 11, wherein
  the pull-up circuit comprises a first PMOS connected to a control node of the switch circuit;
  the first pull-down path comprises a first NMOS and a second PMOS connected between the control node and the first NMOS; and
  the second pull-down path comprises the first NMOS and a second NMOS connected between the control node and the first NMOS.

13. The circuit of claim 12, wherein
  the first PMOS and the first NMOS are controlled by an inverse of the control signal;
  the second PMOS is controlled by the control signal; and
  the second NMOS is controlled by the inversed control signal that is delayed.

14. The circuit of claim 12, wherein
the first PMOS and the first NMOS are controlled by an inverse of the control signal;
the second PMOS is controlled by the control signal; and
the second NMOS is controlled by the driving voltage.

15. The circuit of claim 12, further comprising:
a delay element comprising a first inverter and a second inverter, the first inverter and the second inverter being connected in series,
wherein an input of the first inverter is configured to receive the control signal, and an output of the first inverter is connected to a gate of the first PMOS and a gate of the first NMOS.

16. The circuit of claim 15, wherein
the driver circuit further comprises a third inverter and a delay circuit;
the third inverter is connected between the output of the first inverter and a gate of the second PMOS; and
the delay circuit is connected between the output of the first inverter and a gate of the second NMOS.

17. The circuit of claim 15, wherein
the driver circuit further comprises a third inverter; the third inverter is connected between the output of the first inverter and a gate of the second PMOS and
a gate of the second NMOS is configured to receive the driving voltage.

18. A method comprising:
alternately turning on and off a switch circuit by a driver circuit in accordance with a control signal having a series of pulses for controlling the driver circuit; and
generating a driving voltage by the switch circuit when the switch circuit is turned on,
wherein alternately turning on and off the switch circuit comprises:
when the control signal is in a first state, sequentially activating a first pull-down path and a second pull-down path of a pull-down circuit in the driver circuit in accordance with the control signal to turn on the switch circuit.

19. The method of claim 18, wherein alternately turning on and off the switch circuit comprises:
when the control signal is in a second state, activating a pull-up circuit in the driver circuit in accordance with the control signal to turn off the switch circuit.

20. The method of claim 18, wherein sequentially activating the first pull-down path and the second pull-down path comprises:
delaying the control signal after the first pull-down path is activated; and
activating the second pull-down path in accordance with the delayed control signal.

21. The method of claim 18, wherein sequentially activating the first pull-down path and the second pull-down path comprises:
activating the second pull-down path in accordance with the driving voltage.

\* \* \* \* \*